United States Patent [19]
Sho

[11] Patent Number: 5,616,374
[45] Date of Patent: Apr. 1, 1997

[54] METHOD FOR DEPOSITION OF AMORPHOUS HARD CARBON FILMS

[75] Inventor: Kentaro Sho, Higashimatsuyama, Japan

[73] Assignee: Zexel Corporation, Tokyo, Japan

[21] Appl. No.: 486,571

[22] Filed: Jun. 7, 1995

Related U.S. Application Data

[63] Continuation of Ser. No. 257,042, Jun. 8, 1994, abandoned.

[30] Foreign Application Priority Data

Jun. 11, 1993 [JP] Japan ..................... 5-166439

[51] Int. Cl.⁶ .................. B05D 3/06; C23C 16/30
[52] U.S. Cl. .................. 427/577; 427/523; 427/595; 427/249
[58] Field of Search .................. 427/577, 249, 427/122, 523, 595; 428/408; 423/446

[56] References Cited

U.S. PATENT DOCUMENTS 4,783,368  11/1988  Yamamoto et al. ............ 428/408
5,249,554  10/1993  Tamor et al. .................. 123/90.51

FOREIGN PATENT DOCUMENTS

| 2595718 | 3/1987 | France . |
|---|---|---|
| 3702242A1 | 9/1987 | Germany . |
| 58-126972 | 7/1983 | Japan . |
| 62-157602 | 7/1987 | Japan . |
| 4-300287 | 10/1992 | Japan . |

*Primary Examiner*—Roy V. King
*Attorney, Agent, or Firm*—Burns, Doane, Swecker & Mathis, L.L.P.

[57] ABSTRACT

A method for deposition of an amorphous hard carbon film containing silicon and nitrogen on a substrate wherein a carbon source, a silicon source and a nitrogen source are introduced in a deposition chamber in which the substrate are placed to deposit the film on said substrate.

8 Claims, 4 Drawing Sheets

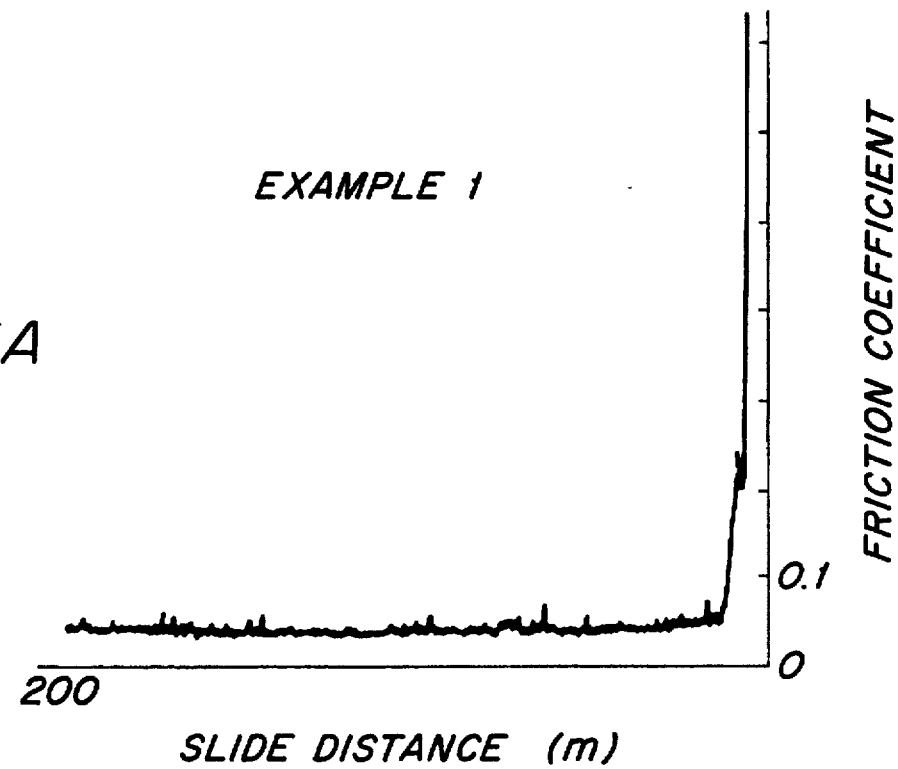
FIG. 3A  EXAMPLE 1
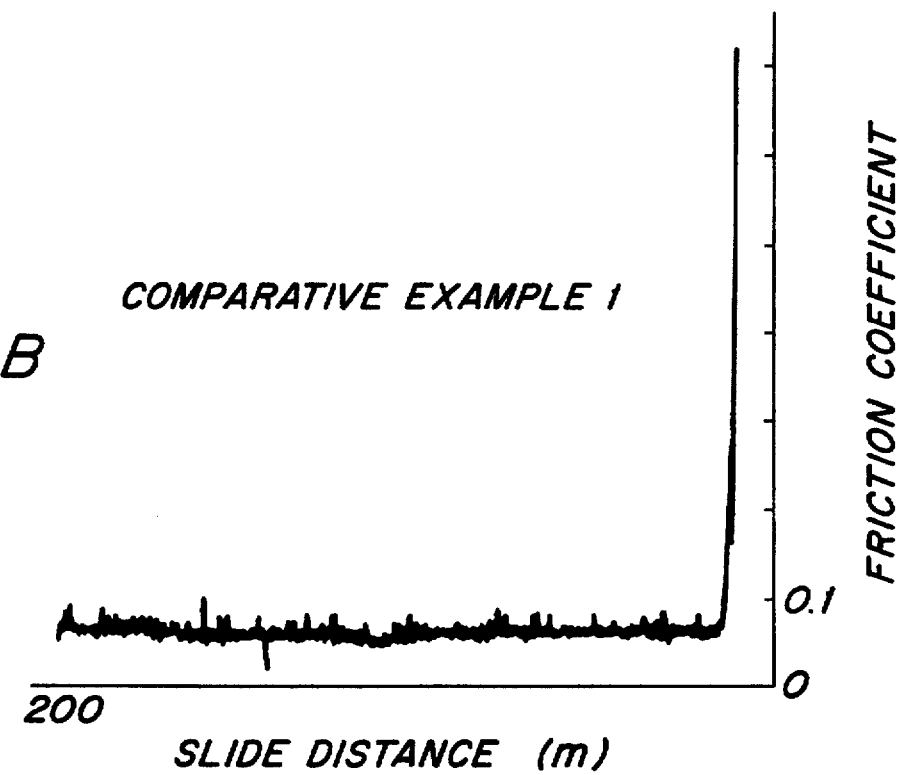
FIG. 3B  COMPARATIVE EXAMPLE 1

FIG. 4
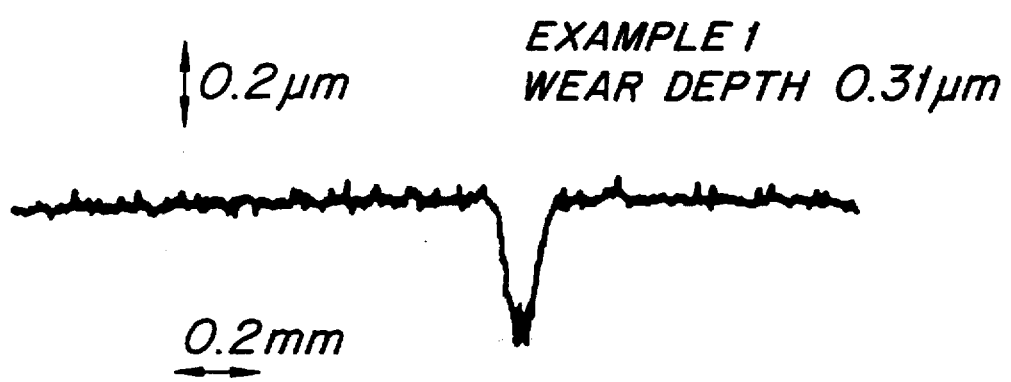
EXAMPLE 1
WEAR DEPTH 0.31μm
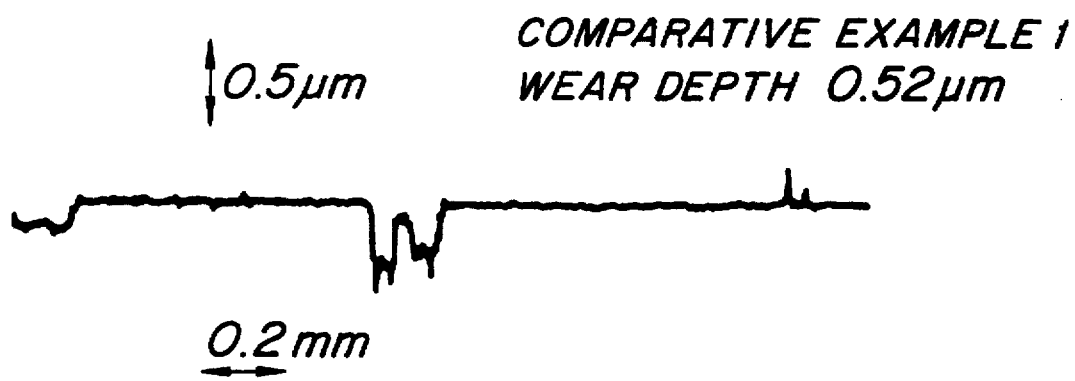
COMPARATIVE EXAMPLE 1
WEAR DEPTH 0.52μm 5,616,374

1

METHOD FOR DEPOSITION OF AMORPHOUS HARD CARBON FILMS

This application is a continuation of application Ser. No. 08/257,042, filed Jun. 8, 1994, now abandoned.

BACKGROUND OF THE INVENTION

The present invention relates to amorphous hard carbon films and methods for preparation the same. More in particular, the present invention relates to amorphous hard carbon films which exhibit good adhesion properties to a substrate and have improved tribological properties, wear resistance and friction coefficient, as well as methods for preparation the same. In addition, the present invention relates to mechanical parts having a surface or surfaces coated with the above amorphous hard carbon film.

Amorphous hard carbon films formed by vapor deposition methods such as CVD methods using a plasma or an ion beam are noted as hard coating materials because of high hardness (Vickers hardness: about 2000–5000). The amorphous hard carbon films are called as amorphous carbon films, diamond-like carbon films, i-carbon films or a-C:H films and are hard carbon films primary comprising amorphous carbon.

The amorphous hard carbon films do not adhere to a substrate depending on the kind of the substrate. Thus various improved methods have been proposed.

For example, Japanese Patent Un-examined Publication (JP-A-) No. 126972/1983 discloses that adhesion properties are improved by providing an intermediate layer between a substrate and an amorphous hard carbon film. However, the formation of the intermediate layer disadvantageously makes a film forming method tedious.

Japanese Patent Un-examined Publication (JP-A-) No. 300287/1992 discloses a method in which adhesive properties are improved by controlling the hydrogen content in an amorphous hard carbon film. The film obtained by this method has not sufficient adhesiveness to a substrate when it is used as coatings of mechanical parts.

Japanese Patent Un-examined Publication (JP-A-) No. 157602/1987 discloses amorphous hard carbon films containing metal elements such as silicon or the like. These films exhibit sufficient properties when they are used as coatings of mechanical parts. That is, the friction coefficient of the film is reduced by the addition of silicon, so that the slidable properties are improved. However, this film is unsuitable for the use as coatings of mechanical parts that are subjected to wear for a long period of time because of the reduced wear resistance and the increased wear.

In order to improve the wear resistance, it is assumed that an amorphous hard carbon film with a surface layer which is free from silicon would be preferred, and such a film is obtainable by a method in which the silicon content is gradually reduced from the bottom to the top of the layer by varying the composition of starting materials. However, the above procedures would be tedious and the adhesion properties would be reduced because of the increased internal stress in the film.

An object of this invention is to provide amorphous hard carbon films which exhibit good adhesion properties to a substrate and have improved tribological properties such as wear resistance and friction coefficient.

A further object of this invention is to provide a method for preparation of the above amorphous hard carbon films.

2

Another object of this invention is to provide mechanical parts in which a slidable member(s) is coated with the amorphous hard carbon film which exhibits good adhesion properties to a substrate and has improved tribological properties such as wear resistance and friction coefficient.

SUMMARY OF THE INVENTION

In accordance with the present invention, there is provided an amorphous hard carbon film deposited on a substrate wherein the film further contains silicon and nitrogen.

In accordance with the present invention, there is also provided a method for deposition of an amorphous hard carbon film containing silicon and nitrogen on a substrate wherein a carbon source, a silicon source and a nitrogen source are introduced in a deposition chamber in which the substrate are placed to deposit the film thereon.

In accordance with the present invention, there is further provided mechanical parts having a slidable member(s) wherein the slidable member is coated with the above-mentioned amorphous hard carbon film.

BRIEF DESCRIPTION OF THE DRAWINGS

FIG. 3 is wear test results from the amorphous hard carbon films of Example 1 and Comparative Example 1.

FIG. 4 is section profiles of wear traces on the amorphous hard carbon films of Example 1 and Comparative Example 1 measured after the wear test.

DETAILED DESCRIPTION

Figure 1:
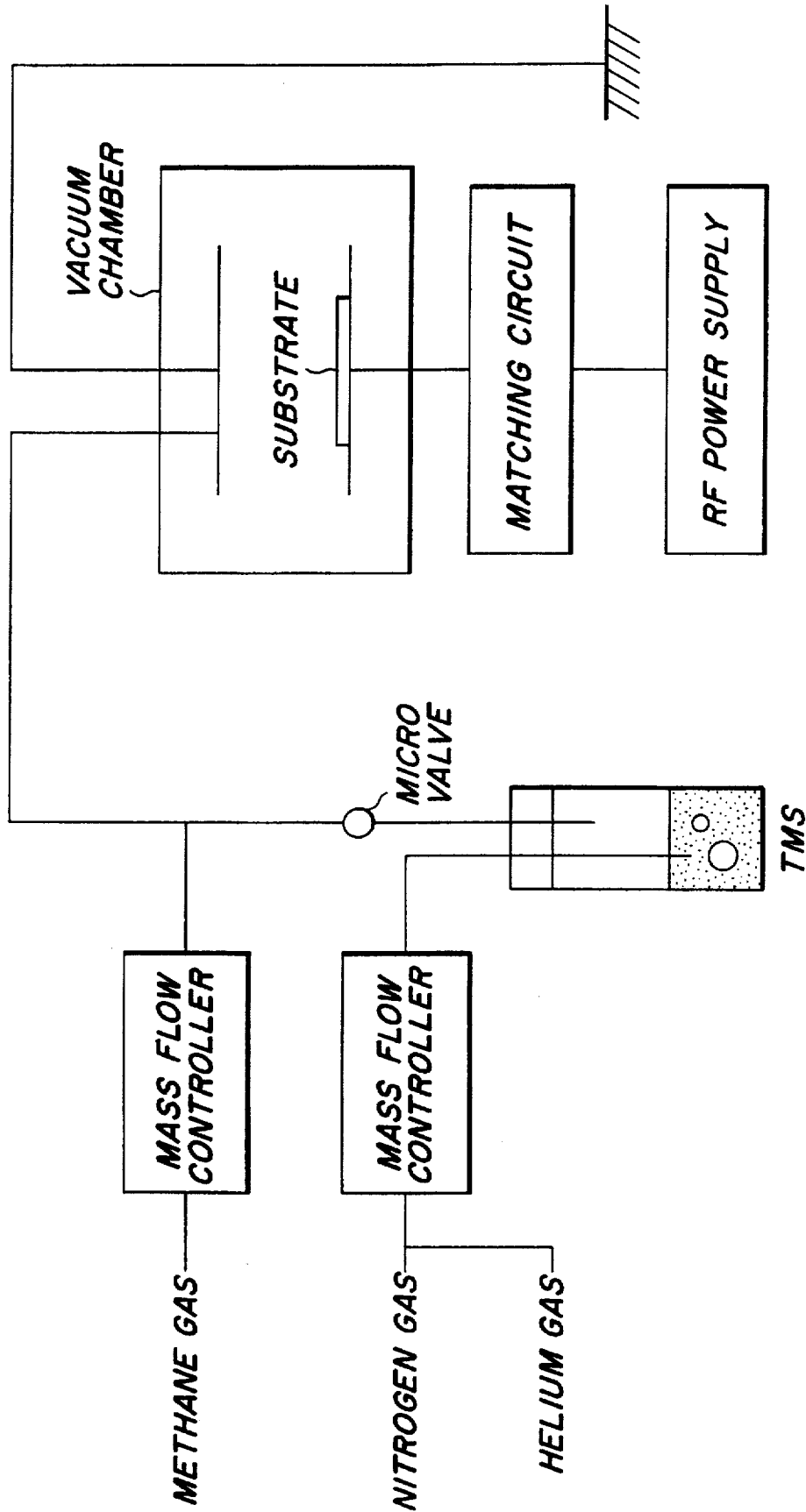
FIG. 1 is a view explaining an apparatus used for a parallel-plates type RF plasma CVD method utilized in Example 1.

Since amorphous hard carbon films generally contain carbon and hydrogen, the films are referred to as a (amorphous) —C (carbon) :H (hydrogen) films. On the contrary, the amorphous hard carbon films of the present invention contain carbon and hydrogen as well as silicon and nitrogen. It is estimated from the results of a Raman spectroscopy measurement or a X-ray diffraction test whether carbon films are amorphous or not. The amorphous hard carbon films of the present invention exhibit high hardness in the range of about 2000–5000 of Vickers hardness.

The hydrogen content in the carbon films is variable by the kind of sources and vapor deposition conditions such as radio-frequency power, reaction pressure and the like, and, for example, ranges from about $0.5-5.0\times10^{22}$ atom/cm$^3$. The films with the above hydrogen content exhibit good adhesive properties to a substrate. The silicon content and the nitrogen content of the carbon films suitably range from about 10–35 atom % and about 0.1–10 atom % respectively from the viewpoint of good adhesiveness and wear resistance.

The amorphous hard carbon film of the present invention is prepared by introducing a carbon source, a silicon source and a nitrogen source into a deposition chamber in which a substrate is placed to deposit an amorphous hard carbon film containing silicon and nitrogen on the substrate.

Examples of the carbon source include hydrocarbons such as methane, acetylene and ethylene. In particular, methane is preferred. Examples of the silicon source include organic silicon compounds such as tetramethylsilane (TMS), SiH$_4$, Si$_2$H$_6$, SiCl$_4$ and SiH$_2$F$_2$. In particular, tetramethylsilane is preferred from the viewpoint of low toxicity and corrosiveness as well as good processability. Examples of the nitrogen source include nitrogen ($N_2$) and nitrogen containing compounds such as ammonia and amines.

Gaseous sources of carbon, silicon and nitrogen are introduced into a deposition vacuum chamber. Thus sources being liquid state at room temperature are introduced into the chamber by the use of a carrier gas. For example, the boiling point of tetramethylsilane (TMS) as the silicon source is 26° C. Thus, a nitrogen gas as the nitrogen source is introduced into tetramethylsilane while the temperature is kept constant to hold its vapor pressure constant and the resulting mixture gas of tetramethylsilane and nitrogen is introduced into the chamber. Inactive gases such as helium and argon can be used as the carrier gas when the sources are introduced into the chamber. Mixtures of a source gas and an inactive gas can be also used as the carrier gas.

The ratio of the silicon source, the carbon source and the nitrogen source suitably ranges 5:0.05–1.0:0.4–4.0 in molar (molecular) ratio of C:Si:N from the viewpoint that amorphous hard carbon films with desirable composition can be obtainable. In particular, when methane is used as the carbon source, tetramethylsilane is used as the silicon source and nitrogen is used as the nitrogen source, the molar ratio of methane, tetramethylsilane and nitrogen suitably ranges 5:0.1–1.0:0.2–2.0 from the viewpoint that amorphous hard carbon films with desirable composition can be obtainable.

The amorphous hard carbon film of the present invention is deposited on a substrate by introducing the above-mentioned sources into the vapor deposition chamber in which the substrate is placed. There is no limitation on a vapor deposition method and any conventional method is applicable. For example, vapor deposition methods using a plasma such as a radio-frequency wave CVD method, ECR-CVD method and sputtering method (PVD) or an ion beam such as an ion plating method (PVD).

Examples of the substrates in this invention include mechanical parts made of an iron alloy or aluminum alloy but there is no intention to limit to the above examples. Every product which can utilize the properties of the amorphous hard carbon film of the present invention can be exemplified as the substrate. Examples of the iron alloys include high speed tool steal and bearing steal. Examples of the aluminum alloys include aluminum alloys such as 4000 series and 6000 series and highly silicon containing aluminum alloys such as ADC10, ADC12, A390 and ASCM.

In particular, according to the present invention, there is provided mechanical parts with a slidable member(s) wherein said slidable member(s) is coated with said amorphous hard carbon film. There is no limitation on the mechanical parts and all parts with a slidable member(s) are included in the scope of the present invention. Examples of the mechanical parts with a slidable member(s) include the slidable parts of compressors, fuel injection pumps and the like.

The thickness of the amorphous hard carbon film of the present invention can be changed by controlling the vapor deposition conditions. The thickness of the film is not limited and can be varied depending on the utilities of the films. The thickness suitably ranges from about 0.1 to 30 μm from the viewpoint that good adhesiveness and wear resistance are obtainable.

The amorphous hard carbon film of the present invention has good adhesive properties to a substrate and its wear loss may be a half of the conventional carbon films. Since the friction coefficient is low and the variation of the coefficient is small, stable slide properties can be obtained. Further, the method of the present invention is easy and convenient, and said amorphous hard carbon film can easily be prepared by the method. In addition, in accordance with the present invention, there is provided mechanical parts made of iron alloy or aluminum alloy having a slidable member(s) coated with the amorphous hard carbon film exhibiting the above-mentioned excellent properties.

EXAMPLES

The present invention will be set forth in detail.

Example 1

A parallel plates type plasma CVD method sketched in FIG. 1 was used. A methane gas and a mixture gas of TMS and nitrogen prepared by bubbling TMS kept at 0° C. with a nitrogen gas as starting gases were introduced into a plasma. A high speed tool steal (SKH51) was used as a substrate. Methane flow rate was 5 sccm, nitrogen flow rate was 1 sccm, a reaction pressure was 8 Pa and input power was 100 W. Under the above conditions, an amorphous hard carbon film was prepared. The growth rate of the film was 5.54 μm/hr. The film was formed for 90 minutes under the above conditions to obtain a carbon film with 8.31 μm of thickness.

Figure 2:
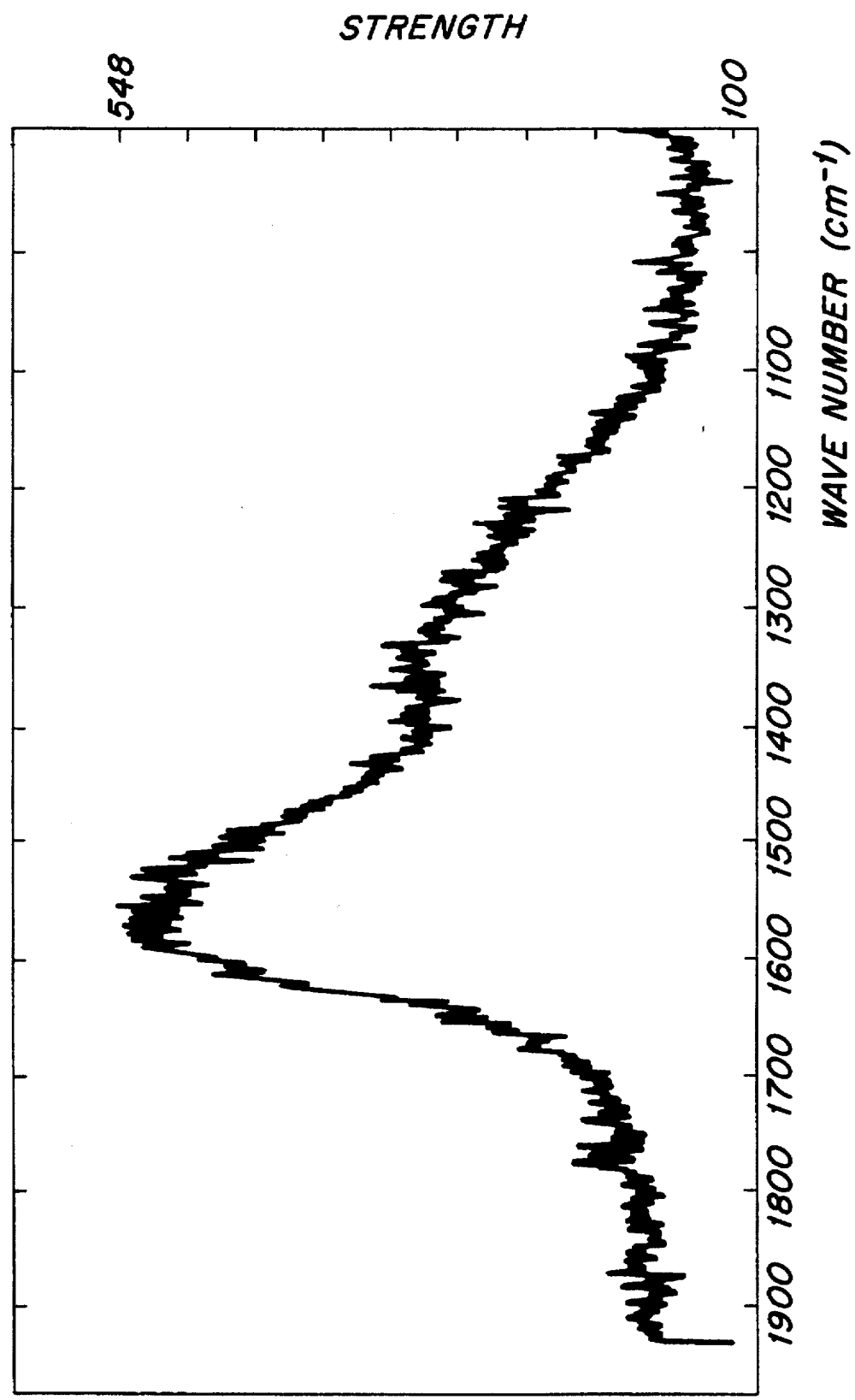
FIG. 2 is a spectrum of the amorphous hard carbon film of Example 1 measured by a Raman spectroscopy.

A spectrum of the obtained carbon film was measured by a Raman spectroscopy. The result is shown in FIG. 2. It was estimated from the result that the resulting carbon film was an amorphous carbon film. Vickers hardness of the carbon film was 2700. Thus the resulting carbon film was identified with an amorphous hard carbon film. The hydrogen content of the amorphous hard carbon film determined from FT-IR was $1\times10^{22}$ atoms/$cm^3$. The silicon content determined from an Auger spectroscopy was 20 atom % and the nitrogen content determined from a X-ray photoelectron spectroscopy (ESCA) was 5.0 atom %.

Comparative Example 1

In accordance with the same procedures as those of Example 1 excepting for that a helium gas was used in place of the nitrogen gas for the introduction of TMS into a plasma, a carbon film with 8 μm of film thickness was obtained. The resulting carbon film was estimated as an amorphous carbon film by a Raman spectroscopy. Vickers hardness of the carbon film was 2500. Thus the resulting carbon film was identified with an amorphous hard carbon film. The hydrogen content of the amorphous hard carbon film determined from FT-IR was $1\times10^{22}$ atoms/$cm^3$. The silicon content determined from an Auger spectroscopy was 21 atom % but nitrogen was not contained in the film.

Comparative Example 2

In accordance with the same procedures as those of Example 1 excepting for that TMS was not introduced into a plasma and a high silicon aluminum alloy was used as a substrate, carbon films with 2 μm and 0.5 μm of film thickness were respectively obtained. The resulting carbon films were estimated as amorphous carbon films by a Raman spectroscopy. Vickers hardness of the carbon films was about 3000. Thus the resulting carbon films were identified with amorphous hard carbon films. The hydrogen content of the amorphous hard carbon films determined from FT-IR was $1.2\times10^{22}$ atoms/$cm^3$. It was determined hard carbon films. The hydrogen content of the amorphous hard carbon from FT-IR that silicon was not contained in the films. Further, nitrogen was not contained in the films from the analysis of EPMA and FT-IR.

Test Example 1—Wear Properties

Wear properties of the amorphous hard carbon film obtained in Example 1 were compared with those of the film obtained in Comparative Example 1.

The results of wear tests are shown in FIG. 3. The wear test was conducted by a Ball-On-Desk wear test machine and the conditions are as follows:

Counterpart material: 6 mm φ SUJ2 balls

Load: 5 N

Slide speed: 60 mm/sec

Slide distance: 200 m

Atmosphere: Air (RH~50%)

Lubricant: Non

As the results, friction coefficient of the carbon film of Example 1 was reduced about 0.02 in comparison with that of Comparative example 1. In addition, as regards the carbon film of Example 1, the variation of friction coefficient was small and slide properties were excellent.

In FIG. 4, section profiles of wear traces on the carbon films of Example 1 and Comparative Example 1 measured after the wear test are shown. As the results, the wear traces on the surface of the carbon film of Comparative Example 1 were about 0.5 μm but those of Example 1 were about 0.3 μm. This means that the wear properties of the amorphous hard carbon film of the present invention was excellent.

Test Example 2—Adhesion properties

Adhesion properties of the amorphous hard carbon film obtained in Example 1 were compared with those of the film obtained in Comparative Example 2.

Although the high silicon aluminum alloy was used as the substrate in Comparative example 2, the amorphous hard carbon film of Comparative example 2 with 2 μm of thickness peeled upon the film formation and therefore, the adhesion properties of the film was obviously bad. Further, the amorphous hard carbon film of Comparative example 2 with 0.5 μm of thickness did not peel during the film formation. This film was subjected to a wear test in a HFC-134a+PAG oil with a high pressure friction test machine. As the result, the film seized even at the lower surface pressure stage (about 5 MPa) and the adhesiveness of the film was bad.

On the contrary, the amorphous hard carbon film of the present invention (Example 1) did not seize at the higher surface pressure (about 40 MPa) in the test by the high pressure friction test machine. Thus the film was excellent in adhesiveness.

What we claim is:

1. A method for deposition of an amorphous hard carbon film comprising silicon and nitrogen on a substrate, which method comprises introducing a carbon source, a silicon source and a nitrogen source to a deposition chamber in which the substrate is placed, and depositing a hard carbon film comprising between about 20 and about 35 atom % of silicon and between about 0.1 and about 10 atom % of nitrogen from said carbon source, said silicon source and said nitrogen source on said substrate.

2. The method of claim 1 wherein the carbon source is a hydrocarbon, the silicon source is an organic silicon compound, and the nitrogen source is nitrogen or a nitrogen containing compound.

3. The method of claim 1 wherein the deposition is carried out by the use of a plasma or ion beam.

4. The method of claim 1 wherein the ratio of the silicon source, the carbon source and the nitrogen source is 5:0.05–1.0:0.4–4.0.

5. The method of claim 2, wherein the carbon source is methane, acetylene or ethylene; the silicon source is tetramethylsilane, $SiH_4$, $Si_2H_6$, $SiCl_4$ or $SiH_2F_2$; and the nitrogen source is $N_2$, ammonia or an amine.

6. The method of claim 1, wherein the substrate is an iron alloy or aluminum alloy mechanical part having at least one slidable member.

7. A method for deposition of an amorphous hard carbon film comprising silicon and nitrogen on a substrate, which method comprises introducing a carbon source, a silicon source and a nitrogen source to a deposition chamber in which the substrate is placed, and depositing a hard carbon film comprising silicon and nitrogen from said carbon source, said silicon source and said nitrogen source on said substrate, wherein the amorphous hard carbon film comprises silicon in an amount of between about 20 and about 35 atom % and nitrogen in an amount which in combination with the silicon is effective for producing an amorphous hard carbon film having improved wear and adhesive properties in comparison with an amorphous hard carbon film which does not comprise nitrogen in combination with silicon.

8. The method of claim 7, wherein the amorphous hard carbon film comprises between about 0.1 and about 10 atom % of nitrogen.

* * * * *

UNITED STATES PATENT AND TRADEMARK OFFICE
CERTIFICATE OF CORRECTION

PATENT NO. : 5,616,374
DATED : Apr. 1, 1997
INVENTOR(S) : Kentaro SHO

It is certified that error appears in the above-indentified patent and that said Letters Patent is hereby corrected as shown below:

At col. 6, line 23, after "5:0.05-1.0:0.4-4.0", please insert:

-- in molar (molecular) ratio of C:Si:N --

Signed and Sealed this

Seventh Day of October, 1997

Attest:

BRUCE LEHMAN

*Attesting Officer*   *Commissioner of Patents and Trademarks*